US007110842B2

(12) United States Patent
Angelo

(10) Patent No.: US 7,110,842 B2
(45) Date of Patent: Sep. 19, 2006

(54) MODULAR DESIGN METHOD

(75) Inventor: Jeffrey Jay Angelo, Kirkland, WA (US)

(73) Assignee: PACCAR Inc., Bellevue, WA (US)

( * ) Notice: Subject to any disclaimer, the term of this patent is extended or adjusted under 35 U.S.C. 154(b) by 0 days.

(21) Appl. No.: 10/848,729

(22) Filed: May 18, 2004

(65) Prior Publication Data

US 2005/0261793 A1 Nov. 24, 2005

(51) Int. Cl.
*G06F 19/00* (2006.01)

(52) U.S. Cl. ............... 700/107; 700/97; 700/98; 700/103; 700/105

(58) Field of Classification Search .......... 700/95, 700/97, 98, 103, 105, 106, 107, 180, 182
See application file for complete search history.

(56) References Cited

U.S. PATENT DOCUMENTS

| | | | |
|---|---|---|---|
| 5,708,798 A | | 1/1998 | Lynch et al. |
| 5,812,130 A | | 9/1998 | Van Huben et al. |
| 6,002,854 A | | 12/1999 | Lynch et al. |
| 6,041,268 A | * | 3/2000 | Jin .................... 700/107 |
| 6,063,128 A | | 5/2000 | Bentley et al. |
| 6,110,213 A | | 8/2000 | Vinciarelli et al. |
| 6,199,157 B1 | | 3/2001 | Dov et al. |
| 6,223,094 B1 | * | 4/2001 | Muehleck et al. ........ 700/107 |
| 6,349,237 B1 | | 2/2002 | Koren et al. |
| 6,449,587 B1 | | 9/2002 | Jungst |
| 6,449,761 B1 | | 9/2002 | Greidinger et al. |
| 6,529,877 B1 | | 3/2003 | Murphy et al. |
| 6,871,108 B1 | * | 3/2005 | Carlucci et al. ............ 700/107 |
| 2004/0225390 A1 | * | 11/2004 | Keller et al. ................ 700/95 |

FOREIGN PATENT DOCUMENTS

EP 0 558 006 A 9/1993

OTHER PUBLICATIONS

Domazet, D.S., et al., An Infrastructure for Inter-Organizational Collaborative Product Development, *Proceedings of the 33rd Annual Hawaii International Conference on System Sciences*, Maui, Hawaii, Jan. 4-7, 2000, pp. 2176-2185.

* cited by examiner

*Primary Examiner*—Leo Picard
*Assistant Examiner*—Charles Kasenge
(74) *Attorney, Agent, or Firm*—Christensen O'Connor Johnson Kindness PLLC

(57) ABSTRACT

A method of modular design suitable for use, for example, in a CAD program is provided. In one aspect, the method is embodied in a CAD program specifically configured to support modular design, or more specifically, concurrent and consistent design of multiple installation assemblies of a product. Each installation assembly consists of a reference assembly and a Bill-of-Material (BOM) assembly. The BOM assembly contains component models that are the modular elements to be designed. The reference assembly contains referenced assemblies that are installed to make up the design environment for the component models in the BOM assembly. The BOM assembly in one installation assembly can be reused as a referenced assembly in the reference assembly of another installation assembly. Any changes made to the BOM assembly are automatically reflected in the reference assembly that contains the same BOM assembly as a referenced assembly.

25 Claims, 15 Drawing Sheets

MODULAR DESIGN METHOD

FIELD OF THE INVENTION

The present invention relates generally to modular design and, more particularly, to a modular design method suitable for use in computer-aided design.

BACKGROUND OF THE INVENTION

Currently, there are two commonly used design methodologies—"Top-Down" design and "Bottom-Up" design. Top-Down design creates lower levels of functional details from upper levels of abstraction. FIG. 1A illustrates one embodiment of the Top-Down design. From a Master Assembly 102 of a product, the product design is divided into Module 1 (104), Module 2 (106), and Module 3 (108). Module 1 (104) contains Component 1 (110). Module 2 (106) is further divided into Module 2.1 (112) and Module 2.2 (114). Module 2.1 (112) is further divided into Component 2.11 (116) and Component 2.12 (118). Module 2.2 (114) contains Component 2.2 (120). Module 3 (108) contains Module 3.1 (122) which, in turn, contains Component 3.1 (124). All design activities take place from within the Master Assembly. Thus, the Master Assembly constitutes the design environment relative to which new Components are designed.

Top-Down design's major strengths are that it allows for concurrent design of multiple Modules and Components, while maintaining a consistent design environment. Thus, Top-Down design makes it easy to assign and manage design responsibilities among multiple designers while minimizing the risk of design errors and duplication of effort. However, it allows for little product variation in the design process and can be cumbersome due to the size and complexity of the Master Assembly. Specifically, the Master Assembly itself represents a specific configuration of the product. As such, when a product variation is required, a new Master Assembly and new Modules containing the variation are also required. Alternatively, the Master Assembly may represent all product variations by adding Modules representing each variation within the Master Assembly. In this case, the Master Assembly is even larger, making it more cumbersome to work with.

Contrary to Top-Down design, Bottom-Up design starts from lower levels of functional details. FIG. 1B illustrates a Bottom-Up design scheme for the same product in FIG. 1A. Here, Component 1 (154) is first designed. Module 1 (156) is formed based on Component 1 (154). Component 2.11 (158) and Component 2.12 (160) are combined to form Module 2.1 (162). Component 2.2 (164) forms Module 2.2 (166). Module 2.1 (162) and Module 2.2 (166) jointly form Module 2 (168). Component 3.1(170) forms Module 3.1 (172) which, in turn, forms Module 3 (174). Module 1(156), Module 2 (168), and Module 3 (174) jointly form the Master Assembly (176), which is the same product as created in the Top-Down design of FIG. 1A. Since the Components are designed prior to forming the Modules and the Master Assembly, the Master Assembly and Modules are not available for use as the design environment used to design the Components. Instead, design environments are created, as Layout Assemblies as shown in FIG. 1C, by different designers each being responsible for one or more Components. For example, the Layout Assembly 180 of FIG. 1C consists of the Components 181 and 182 that one designer is designing, commingled with the Components 184–187 which he wishes to reference and are being designed by others.

Bottom-Up design's major strengths are its flexibility to handle the design of products with unlimited product variations and the relatively small design environments produced. For example, in FIG. 1C, Component 181 can be combined with any other components to produce a different Layout Assembly to be used as the design environment for designing a new component. The new component can be combined with any other components to produce a different module which, in turn, can be combined with other modules to produce a different product. This characteristic of the Bottom-Up design is also the major weakness of the Top-Down design. However, the Bottom-Up design does not provide a consistent design environment for multiple modules/components and, therefore, is not suited for permitting concurrent design of multiple modules/components, nor is it suited to permit easy management of design responsibilities among multiple designers.

A good design effort would need to combine the strengths of both the Top-Down design and the Bottom-Up design. Thus, there is a need for a design approach that strikes a balance between the Top-Down design and the Bottom-Up design, to achieve the strengths of both the Top-Down design and the Bottom-Up design while minimizing their weaknesses. The result would be a design approach that combines the flexibility of the Bottom-Up design to handle unlimited product variations, with the efficiency and the consistency of the Top-Down design to provide for concurrent design, common and consistent design environments, and the ability to readily assign and manage design responsibilities among multiple designers. The present invention is directed to providing such a design approach.

SUMMARY OF THE INVENTION

The present invention offers a modular design method, which achieves the benefits and strengths of both the Top-Down design and the Bottom-Up design. The method generally comprises three steps. First, multiple designers are each assigned a design responsibility for a portion of the product. Second, each designer creates an installation assembly for his design responsibility. The installation assembly represents the installed location, relative to the overall product, of a set of components to be used together for which the designer is responsible. The installation assembly includes a reference assembly and a Bill-of-Material (BOM) assembly. The reference assembly contains one or more pre-configured assemblies that are "referenced" by the designer to define the design environment for the installation assembly. The BOM assembly contains the set of components being designed (or positioned) by the designer.

Any of the BOM assemblies designed by various designers in this modular design environment can be "reused" or referenced in a reference assembly for designing another BOM assembly. In the present description, the BOM assembly that is designed and controlled by the designer responsible for the designing of this BOM assembly is called the "original" BOM assembly, while the same BOM assembly referenced in reference assemblies for designing other BOM assemblies are called "referenced" BOM assemblies. Any changes made to the original BOM assembly are automatically reflected in the same BOM assembly reused in any other reference assemblies (i.e., in the "referenced" BOM assemblies). Therefore, different designers, each responsible for the design of a portion of a product (i.e., "his" BOM assembly), can continuously reference each other's finished and/or unfinished work that defines the design environment for each other, so as to maintain a consistent design environment amongst themselves, as in the Top-Down design. At the same time, the modular design method of the present invention permits each designer to maintain a relatively small design environment for his task, and also allows flexibility to handle unlimited product variations, as in the Bottom-Up design.

The modular design method of the present invention may be applied in various designing contexts, including the designing of software. The modular design method of the present invention wherein each designer can continuously reference each other's work is highly advantageous especially when the overall product is relatively large and/or has many variations and it is desirable or necessary to apportion the design responsibility amongst multiple designers. Accordingly, it should be noted that the term "Bill-of-Material (BOM)" is used herein to refer to any components, ingredients, or materials needed to manufacture a hardware or software product, and is not limited to only physical components.

In accordance with another aspect of the present invention, the modular design method of the present invention is applied in Computer-Aided Design (CAD). As with the designing of software, CAD designing of a relatively large and complex product, such as a truck, becomes significantly easier and more efficient when done in the modular design environment of the present invention. In this connection, in accordance with a further aspect of the present invention, a method is provided for specifically configuring a Computer-Aided Design (CAD) program to support modular design. The configuration method includes creating distinct model types and creating rules associated with each model type. The model types include an installation assembly, a reference assembly, a Bill-of-Material (BOM) assembly, and a component (which may be a part or an assembly). The CAD program configured to support modular design permits concurrent design of plural installation assemblies by multiple users, by allowing the users to reference each other's finished or unfinished work.

Specifically, the creation of an installation assembly comprises the creation of a reference assembly, a BOM assembly, and a global reference that is used to locate the installation assembly, the reference assembly, and the BOM assembly relative to one another. The BOM assembly contains the component models that are the modular elements to be designed. The reference assembly defines the design environment for designing the BOM assembly and consists of one or more "referenced" models. The referenced models can be BOM assemblies or component models as originally defined in other installation assemblies. Thus, a BOM assembly (including one or more component models), once created, can be reused in reference assemblies of other BOM assemblies to define the design environments for these other BOM assemblies. Any changes made in an original BOM assembly (including one or more component models) are automatically reflected in any reference assembly that contains the BOM assembly as a "referenced" BOM assembly. Hence, concurrent design of plural installation assemblies is made possible where each installation assembly can reference the BOM assemblies of other installation assemblies, so as to constantly update its reference assembly containing those BOM assemblies as referenced BOM assemblies.

In accordance with a still further aspect of the present invention, a computer-readable medium containing executable instructions to support modular design in a CAD program is provided. The medium includes instructions for a computer to perform generally two steps. First, the computer prompts a user to define an installation assembly, wherein the installation assembly consists of a reference assembly containing one or more referenced assemblies, and an original BOM assembly. Second, the computer automatically updates changes in any original BOM assembly, by reflecting the changes made in the original BOM assembly in a reference assembly that contains the BOM assembly as a referenced assembly.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a modular design methodology. This methodology utilizes a new, overall assembly architecture for the design of a product. The modular design does not require a Master Assembly of the entire product for the design environment (as required in the Top-Down design), nor does it require the build-up of design environments from individual components (as required in the Bottom-Up design). Briefly, the modular design of the present invention is based on plural installation assemblies, which jointly form a product. While the present invention is described mostly in reference to its application in CAD, it should be appreciated that the CAD application is provided merely as an example and the modular design method of the present invention may be applied in various other designing contexts.

Figure 2A:
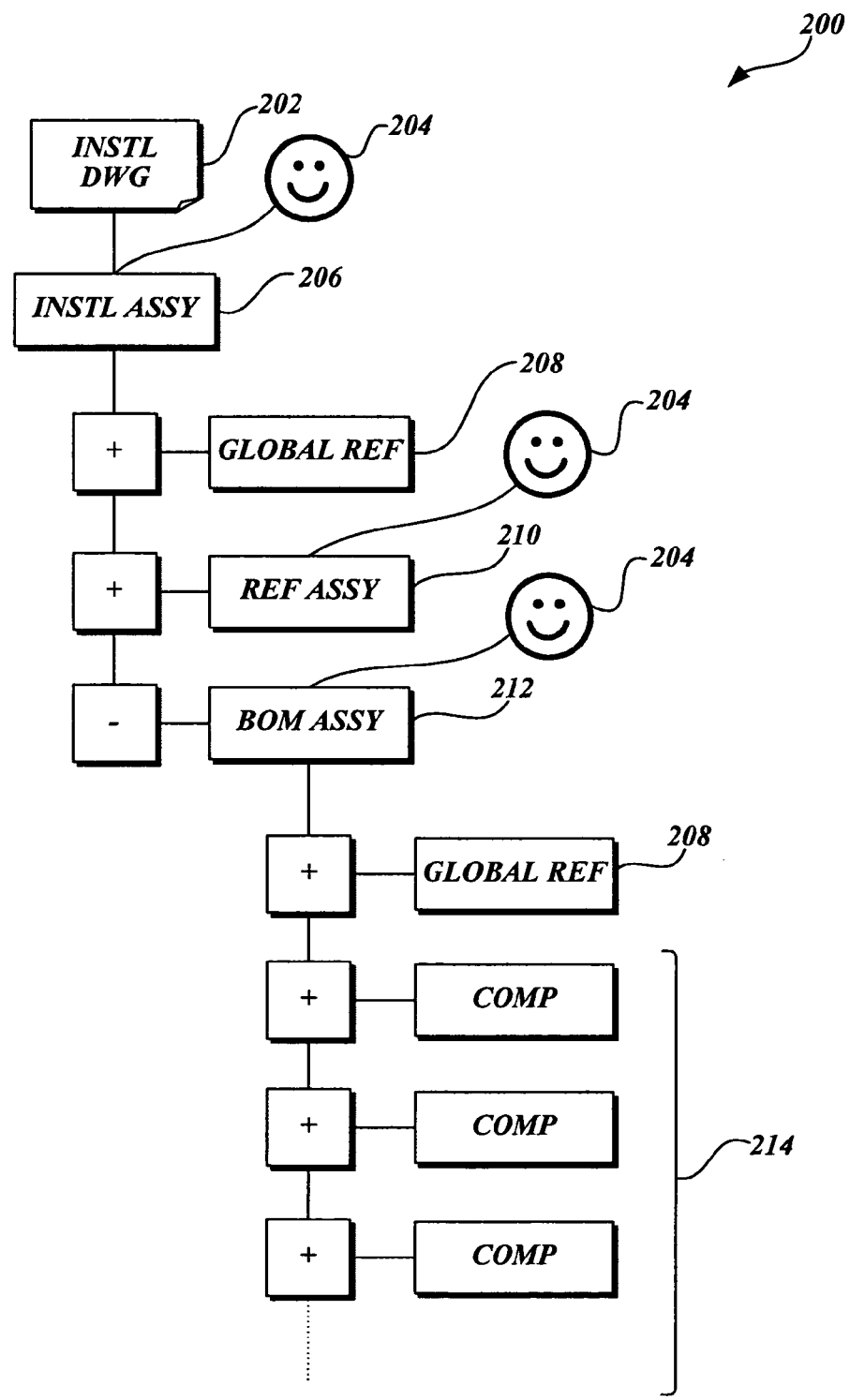
FIG. 2A is a block diagram illustrating one embodiment of the present invention.

FIG. 2A illustrates the file structure of an installation drawing (202), which is partially-exploded to show the assembly architecture of an installation assembly (206). The installation assembly (206) represents the installed location, relative to the overall product, of a set of component models (214) that are used together. In other words, the installed location means a location at which the set of component models (214) is to be installed in the product. Each of the component models (214) represents a part, or an assembly of parts, and the term "component model" is used interchangeably with the terms "component", "component assembly," and "part" in the present description.

The installation assembly (206) is divided into two sub-assemblies: a reference assembly (210) and a Bill-of-Material (BOM) assembly (212). A reference assembly (210) may contain any models that are "referenced" to define the design environment for this installation assembly (206), as will be more fully described below in reference to FIG. 3. A BOM assembly (212) contains the component models (214) to be designed and/or positioned at the installed locations. Specifically, some component models may need to be designed, while other pre-existing component models may be reused, if appropriate, with their proper positions being specified in the BOM assembly. References are established and maintained between the component models (214) of the BOM assembly (212) and the models included (or referenced) in the reference assembly (210), which provide the design environment for the BOM assembly (212). This allows the component models (214) contained in the BOM assembly (212) to be located (and designed, if need be) in their installed positions in a three-dimensional space with respect to the other components with which they interface (i.e., in the proper design environment).

A naming convention may be used to explicitly indicate the association between the installation assembly (206) and its corresponding reference assembly (210) and BOM assembly (212). For example, a common base number may be used for all three, with a unique suffix for each model type, such as: (number)_INSTL, (number)_REF, and (number)_BOM.

Figure 3:
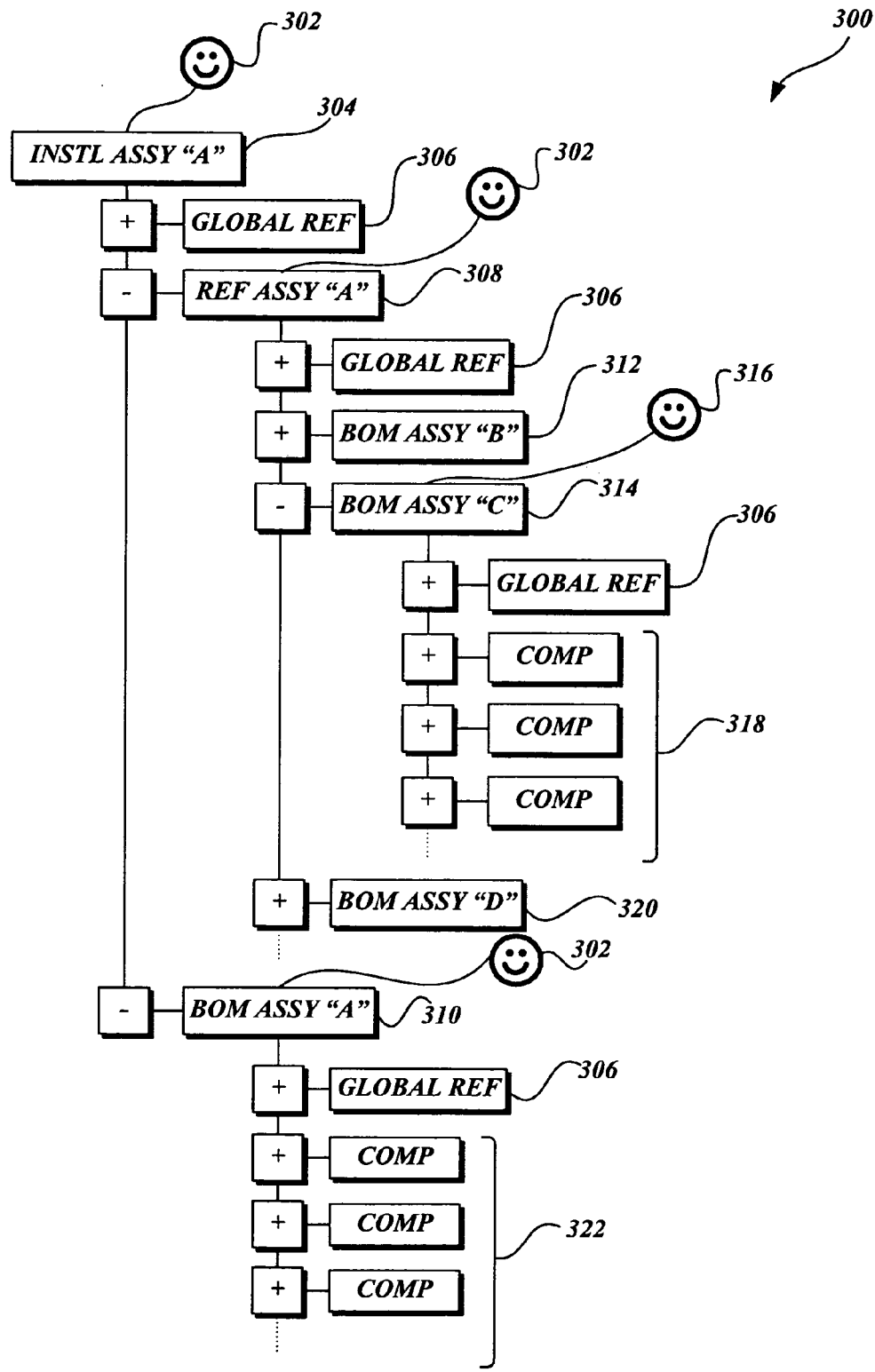
FIG. 3 is a block diagram illustrating one aspect of the present invention.

Additionally, a global reference (208) representing a common global reference, or set of references, is included under each of the installation assembly (206), reference assembly (210) (not shown in FIG. 2A—but see FIG. 3 (306)), and BOM assembly (212). The global reference (208) is used to locate the installation assembly (206), reference assembly (210), and BOM assembly (212) relative to one another (e.g., by matching the global references of various assemblies), thus insuring uniform and consistent placement of the various assemblies. A global reference is simply a universally recognized or agreed-upon landmark on the product to be designed. A global reference may be defined as any combination of points, lines, axis, curves, planes surfaces, etc. of the product being designed, that are sufficient to capture all six degrees of freedom (x, y & z translations and x, y, & z rotations) in 3D space for the portion of the product represented by the global reference. Global references thus can be expressed in any suitable coordinate systems (e.g., Cartesian, three datum planes, 2 axes, etc.) using mathematical expressions that can specify/define a location (or locations) in the 3D space. On relatively simple products a single landmark may suffice. On more complex products multiple landmarks, representing sub-portions of the product, may be desired.

For example, in the case of designing a truck, the sub portions may include: the cab, the chassis, the front suspension, the engine, etc. with a global reference used to represent each of these sub-portions. The cab global reference may be represented by a coordinate system located at the intersection of the front of cab plane, the top of floor plane, and the center of cab plane. The chassis global reference may be represented by a coordinate system located at the intersection of the center plane of the chassis, bottom surface of the frame rails, and the front of the frame rails, etc. When multiple landmarks are used, the relative position between the landmarks may vary for different configurations of the product. Therefore, in order to precisely locate (or position) the installation assemblies, reference assemblies, and BOM assemblies with respect to each other, each of the assemblies must contain common global reference(s). For example, in the case of designing a truck, if an installation assembly contains global references "Cab" and "Chassis", then its associated reference assembly and BOM assembly need to contain at least "Cab" or "Chassis". They may contain both "Cab" and "Chassis," and additionally "Front Suspension" and/or "Engine", etc. When multiple common global references exist in the parent assembly and its associated sub-assembly, the relative position between the common global references must also be common between the parent assembly and the sub-assembly, for common product configurations. (This can be a manual process to ensure that the requirement is met, or the CAD program could be set up to programmatically enforce the requirement). On the other hand, different product configurations will require only that a single "primary" global reference be in common between a parent assembly and its associated sub-assembly, and other "secondary" global reference(s) need not be in common.

It should be noted that some product variations arising from the redesign/addition/deletion of component models may change the relative position between global references. Therefore, a relational data base or other means may be required to manage the relative position/product variation matrix. Furthermore, the component models included in various BOM assemblies are located in 3D space with respect to one or more of these global references. Accordingly, a BOM assembly is re-usable for a new product variation only if the following two conditions are met: (1) the product variation requires the component models specified within the BOM assembly; and (2) the product variation requires those component models at the locations they occupy within the BOM assembly with respect to the landmarks (global references) that are included in the BOM assembly.

The installation assembly (206) and its associated reference assembly (210) and BOM assembly (212) are created and maintained by the person or persons (204) responsible for specifying and/or locating the component models (214) to form the BOM assembly (212). The BOM assembly (212) containing the component models (214) may then be reused for reference purposes, i.e., within a reference assembly to define a design environment for another BOM assembly, without bringing with it its associated reference assembly (210) originally used for its creation, as will be described in greater detail below.

Figure 2B:
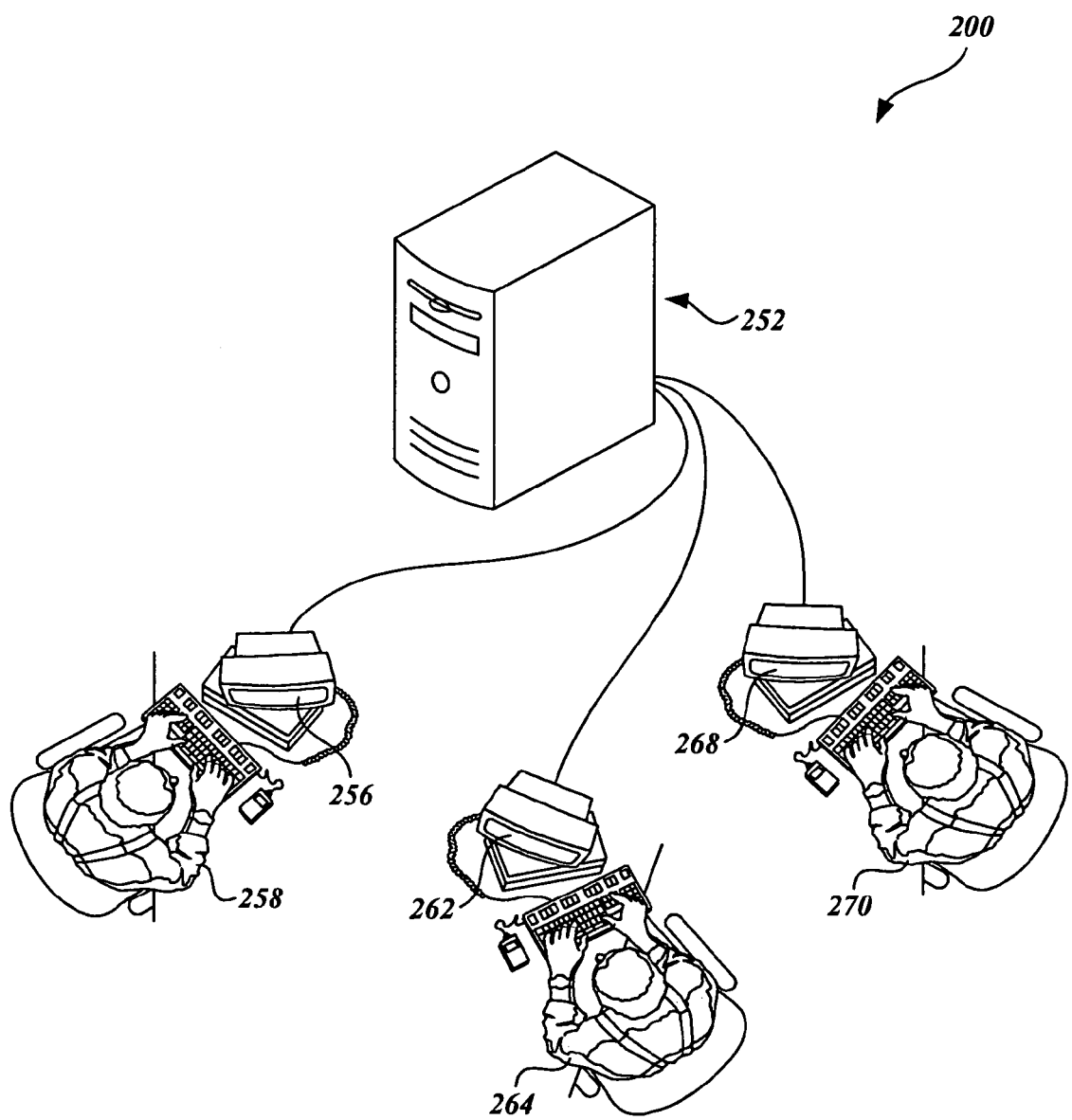
FIG. 2B is a system diagram illustrating one embodiment of the present invention.

FIG. 2B illustrates the advantage of the present invention in supporting concurrent design by multiple designers in a consistent design environment. In the illustrated embodiment, designers (258), (264), (270) are using the CAD programs (256), (262), (268) interconnected via a CAD server (252). Because any changes made to a BOM assembly (consisting of one or more components) are automatically reflected in the same BOM assembly reused in a reference assembly for another BOM assembly, Designer 1 (258), Designer 2 (264), and Designer 3 (270) can work on their individual design responsibilities at the same time, even when they need to reference each other's unfinished BOM assemblies or component models. Further, a common and consistent design environment is ensured by each designer referencing common BOM assemblies which are located at common locations, as ensured by common global references. Still further, each designer (258), (264), (270) has his specific design responsibility, which can be readily managed. Each designer designs and updates the changes to a particular portion of the product to which the designer is assigned (e.g., a particular BOM assembly). Additionally, because each designer has total control over the particular portion of the product being designated within his reference assembly, he has the freedom to use any previously created BOM assembly (or BOM assemblies) to create various different products (or product variations), and thus the modular design of the present invention allows for unlimited product variation.

FIG. 3 illustrates an installation assembly A (304) with its reference assembly A (308) exploded to show the assembly architecture within. BOM assemblies B (312), C (314), D (320), etc. (created in a similar fashion to the BOM assembly (212) described above in reference to FIG. 2A) are reused in the reference assembly A (308). They are now used to define the reference environment (design environment) necessary for the design development and location documentation of another BOM assembly A (310) including plural component models (322). This reuse of BOM assemblies to define the reference environment for another BOM assembly is the key to achieving the benefits of the concurrent modular design concept of the present invention.

One of these reused (or referenced) BOM assemblies C (314) in the reference assembly A (308) has been exploded to further illustrate the benefits of this design architecture. By adding BOM assembly C (314) into reference assembly A (308), the designer (302) responsible for installation assembly A (304), including its corresponding reference assembly A (308) and BOM assembly A (310), automatically receives the correct component models (318) in the BOM assembly C (314) at their correct locations as specified by another person (316) responsible for the original BOM assembly C. In addition, as component models (318) are added, removed, replaced, or relocated within the original BOM assembly reused as BOM assembly C (314) by the person (316) responsible for the original BOM assembly C, those changes are automatically reflected in the BOM assembly C (314) as included in the reference assembly A (308) (and in the BOM assembly C (314) included in any other reference assemblies), simply by updating any BOM assembly C (314) to its latest version as controlled by the person (316). The automatic updating may be carried out fully automatically (e.g., periodically), or semi-automatically (e.g., upon receiving a request for an update from a designer using the BOM assembly in his reference assembly or from a designer responsible for the design of the BOM assembly).

The reference assembly A (308) is custom-built by the person (302) who is responsible for BOM assembly A (310). Therefore, it can be tailored to include only those BOM assemblies B (312), C (314), D (320), etc. that are pertinent to the installation of component models (322) included in the BOM assembly A (310), thus making the reference assembly A (308) relatively smaller and hence easier to use. This is a major advantage of the modular design method of the present invention over the Top-Down design method, which is often cumbersome to use due to a large and complex design environment required.

Figure 4A:
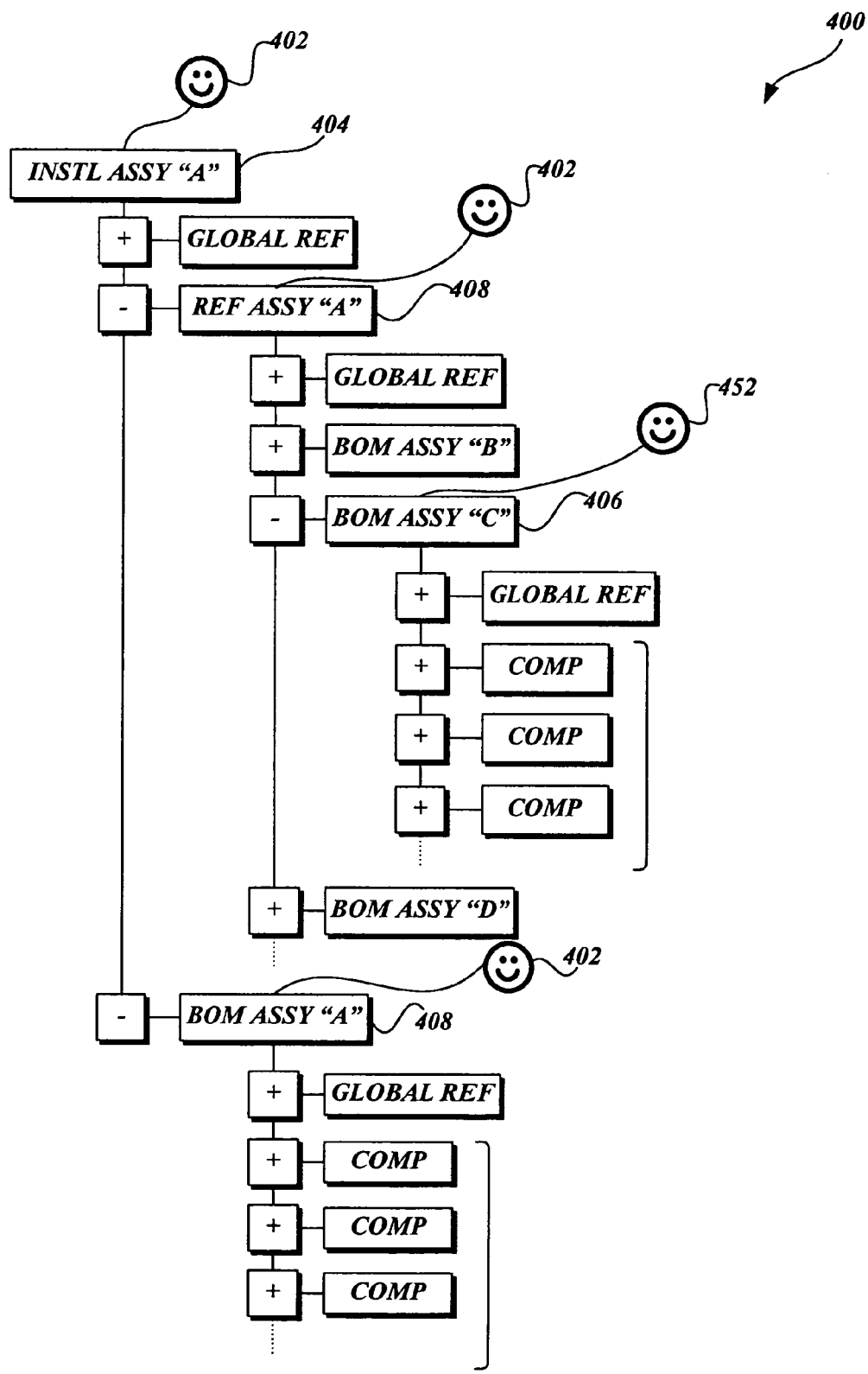
FIGS. 4A–4B are block diagrams illustrating another aspect of the present invention.
Figure 4B:
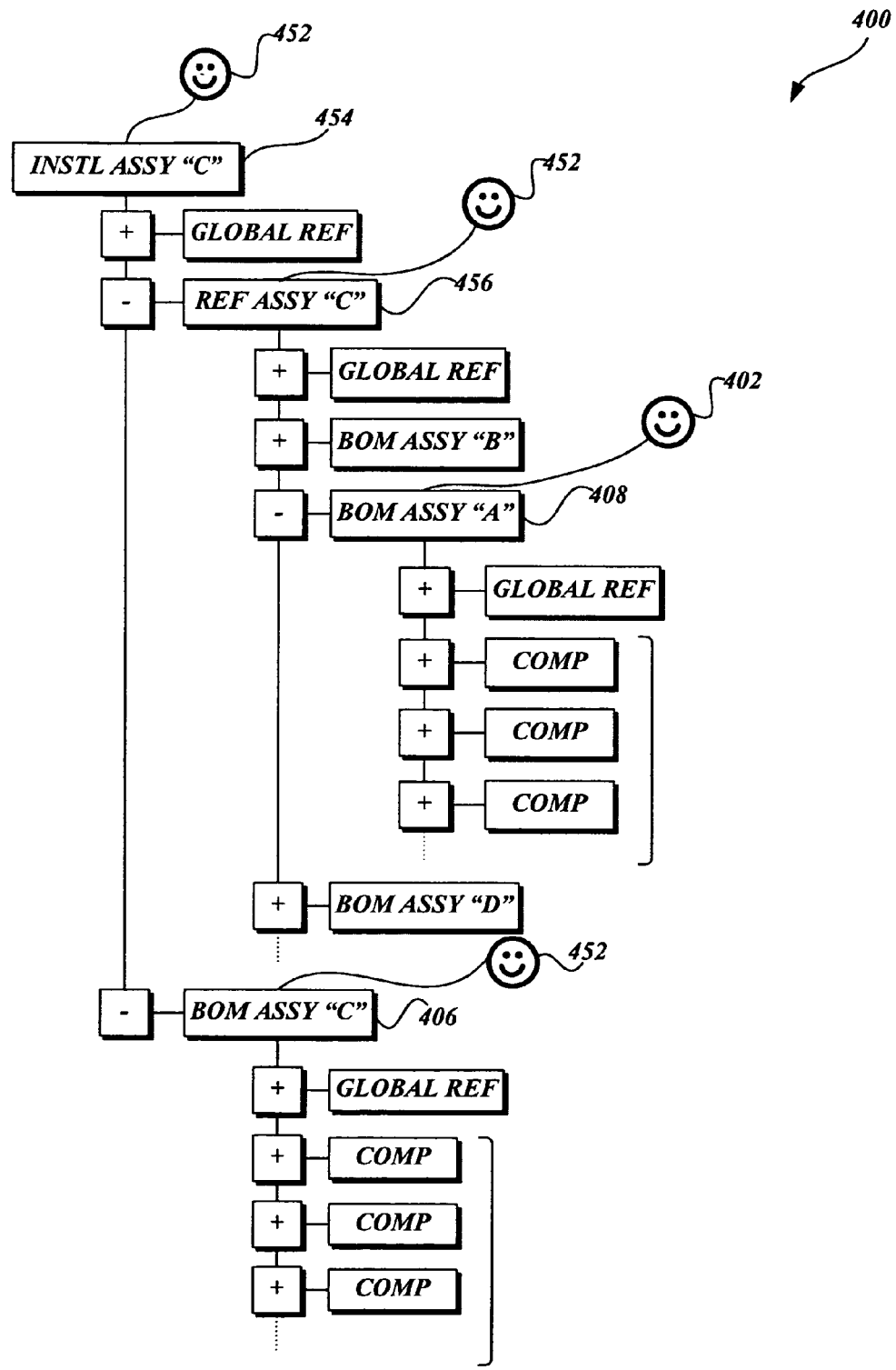

FIGS. 4A–4B illustrate two installation assemblies A (404) and C (454), partially exploded to show how the present invention supports concurrent design. As shown in FIG. 4A, the designer (402) of installation assembly A (404) references BOM assembly C (406) in order to define a design environment for the BOM assembly A (408). Simultaneously, as shown in FIG. 4B, the designer (452) of installation assembly C (454) references the work done by designer (402) by adding the designer (402)'s BOM assembly A (408) into the reference assembly C (456). As a result, each designer can see and reference the work of the other. In addition, each reference environment is automatically updated as changes are made in any of the original BOM assemblies by the designers responsible for these BOM assemblies, without the need to manually replicate the changes in each reference assembly.

The modular design method according to the present invention provides for improved efficiency over the Bottom-Up design, since fewer models (i.e., BOM assemblies) need to be identified and assembled in order to create a new reference assembly. Efficiency over the Bottom-Up design is further improved by the automatic updating of referenced BOM assemblies to reflect changes in the original BOM assemblies as described above. The modular design method further provides for reduced risk of error and appropriate design responsibilities, since the components being referenced are specified and located with respect to one another by the person(s) responsible for the portion(s) of the product (BOM assemblies) being referenced, rather than by the person merely referencing those components as in the Bottom-Up design.

The modular design method further provides for improved efficiency over the Top-Down design, also, since a Master Assembly of an entire product need not be built each time a new product is to be designed. This is especially important for large, complex products that have a large number of unrelated variations within the product. With traditional Top-Down design, a separate Master Assembly representing each permutation of the product variables would be required, or a Master Assembly of an entire product must be built including all of the product permutations. In either case, the number of models required increases exponentially with each additional variable. The modular design method according to the present invention does not have this problem, since only the variable elements (BOM assemblies) are required to design a varying product. The permutations of the variable elements are created only as needed, and only to the extent required for the creation of new BOM assemblies by adding those existing BOM assemblies that are pertinent to the new BOM assemblies into the reference assemblies of the new BOM assemblies.

Efficiency over the Top-Down design is further improved by the capability within the modular design method to simultaneously design multiple product variations. This is achieved by establishing a "primary" global reference in the reference assembly, relative to which the multiple product variations will be viewed. The appropriate BOM assemblies and/or "master" reference assemblies (to be described fully below) and/or component models representing the multiple product variations pertinent to the BOM assembly being designed are then added to the reference assembly, located relative to the "primary" global reference. This creates a composite design environment of the various product variations, overlaid one upon the other as viewed from the common perspective of the primary global reference. The BOM assembly designed relative to this composite design environment will therefore be compatible with each individual product variation included in the composite.

Figure 4C:
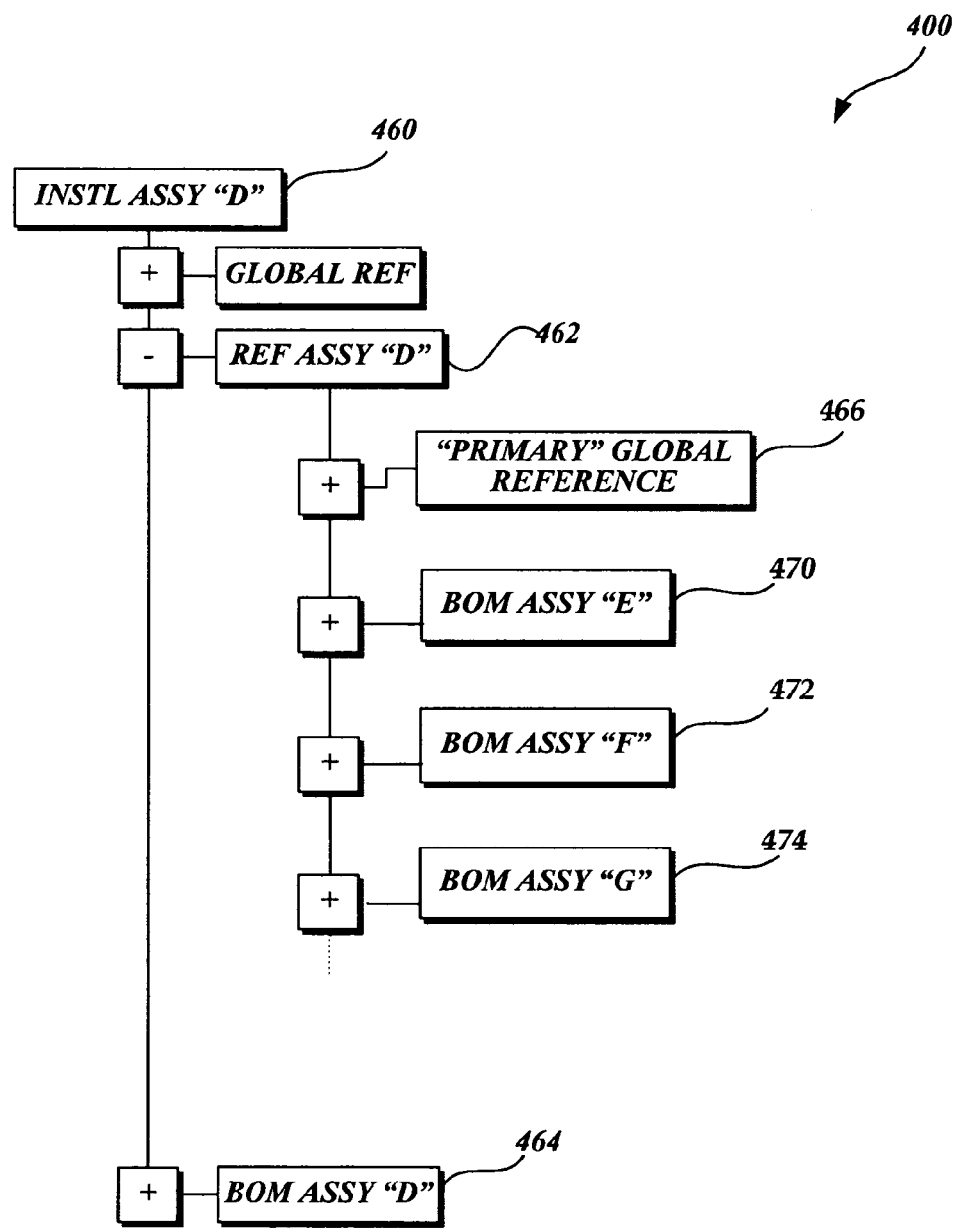
FIG. 4C is a block diagram illustrating the use of a "primary" global reference suited for simultaneously designing multiple product configurations.

FIG. 4C illustrates this concept, wherein an installation assembly "D" (460) includes a reference assembly "D" (462) and a BOM assembly "D" (464), as before. The reference assembly "D" (462) includes a designer-defined "primary" global reference (466) and multiple BOM assemblies "E" (470), "F" (472), "G" (474), etc. These BOM assemblies "E", "F", "G", etc. represent, in combination, the multiple design environments for the BOM assembly "D" (464) as used in multiple product variations. Since each of these BOM assemblies "E," "F," "G," etc. is located relative to the "primary" global reference (466), the reference assembly "D" (462) as a whole provides a composite and cohesive design environment of the various product variations. Therefore, the BOM assembly "D" (464) designed relative to this composite design environment will be compatible with each individual product variation.

For example, in the case of designing a truck, a portion of the truck, such as the cab, may be reused for multiple truck configurations. These various configurations may place the cab at different positions relative to the chassis, such as: near the front of the chassis for a short hood, small engine configuration; and farther back for a mid sized hood and mid engine configuration; and still further back for a long hood, large engine configuration. The cab firewall would need to accommodate all engines. By establishing the "Cab" as the "primary" global reference, and building the design environment (reference assembly) with respect to it, the designer sees the variations in the design environment from the perspective of the cab. Specifically, still referring to FIG. 4C, the designer responsible for the installation assembly "D" (460) for designing the BOM assembly "D" (464) can select any global reference, which is best suited for use as a common point of reference with respect to various design configurations, as the "primary" global reference (466). With traditional Top-Down design, the firewall designer would only be able to view one engine-to-firewall relationship at a time due to each Master Assembly representing a single product configuration, or alternatively if the Master Assembly contained all product variations, those variations would take place relative to the common reference point initially established for the Master Assembly which may be different than the desired reference point for the particular design task. For example, in the design of a truck, the Master Assembly may be set up to show all product variations relative to the front of the truck, where in the design task outlined above, it would be desirable to show or view the product variations from the perspective of the cab instead. Thus the ability of the modular design method to customize the point of view relative to which product variation is shown on a case by case basis is a major benefit over Top-Down design.

Figure 5:
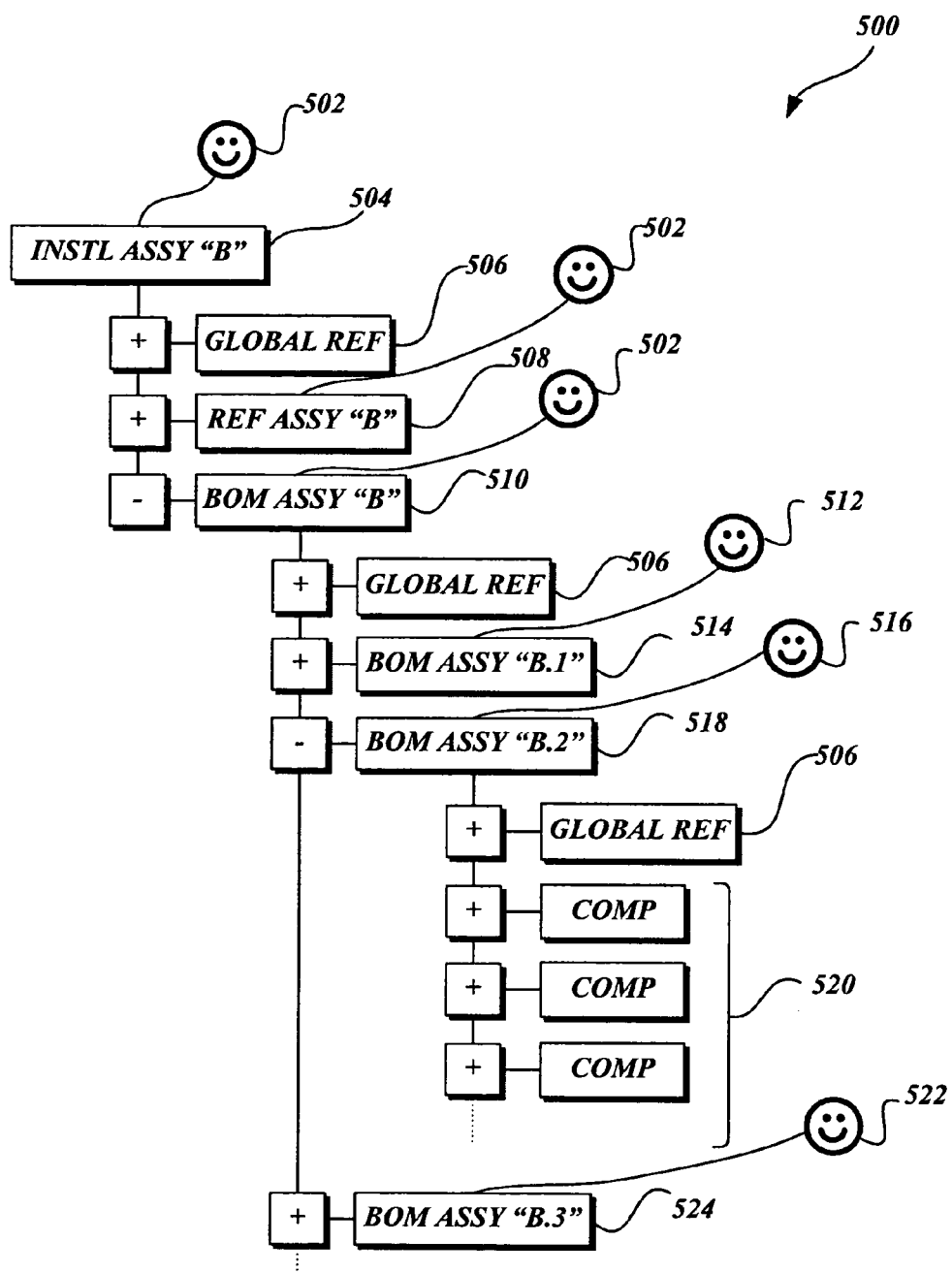
FIG. 5 is a block diagram illustrating one embodiment of the present invention incorporating the Top-Down design.

FIG. 5 illustrates another embodiment of the present invention, wherein a portion of the product is modeled using the traditional Top-Down concept (Variant I). In this embodiment, the BOM assembly B (510) can be considered a top-level Master Assembly of the portion of the product to be designed according to the Top-Down design approach. Under the top-level BOM assembly B (510), sublevel BOM assemblies B.1 (514), B.2 (518), B.3 (524), etc. are provided as sublevel Master Assemblies. The subdivision continues down as many levels as desired. The subdivision allows the product to be divided into different regions, functions, systems, etc. with different persons (512), (516), (522), etc., assigned with responsibility for the different sublevel BOM assemblies B.1 (514), B.2 (518), B.3 (524), etc., respectively.

A global reference (506) is added to the top-level BOM assembly B (510) and the sublevel BOM assemblies B.1 (514), B.2 (518), B.3 (524), etc., to make them available for reuse within other reference assemblies, as described above.

Using this approach illustrated in FIG. 5, large, complex, and highly-variable products can be broken down into modular elements according to the modular design method of the present invention, and further, the traditional Top-Down design method can be used within each of the modular elements, if desired.

Figure 6:
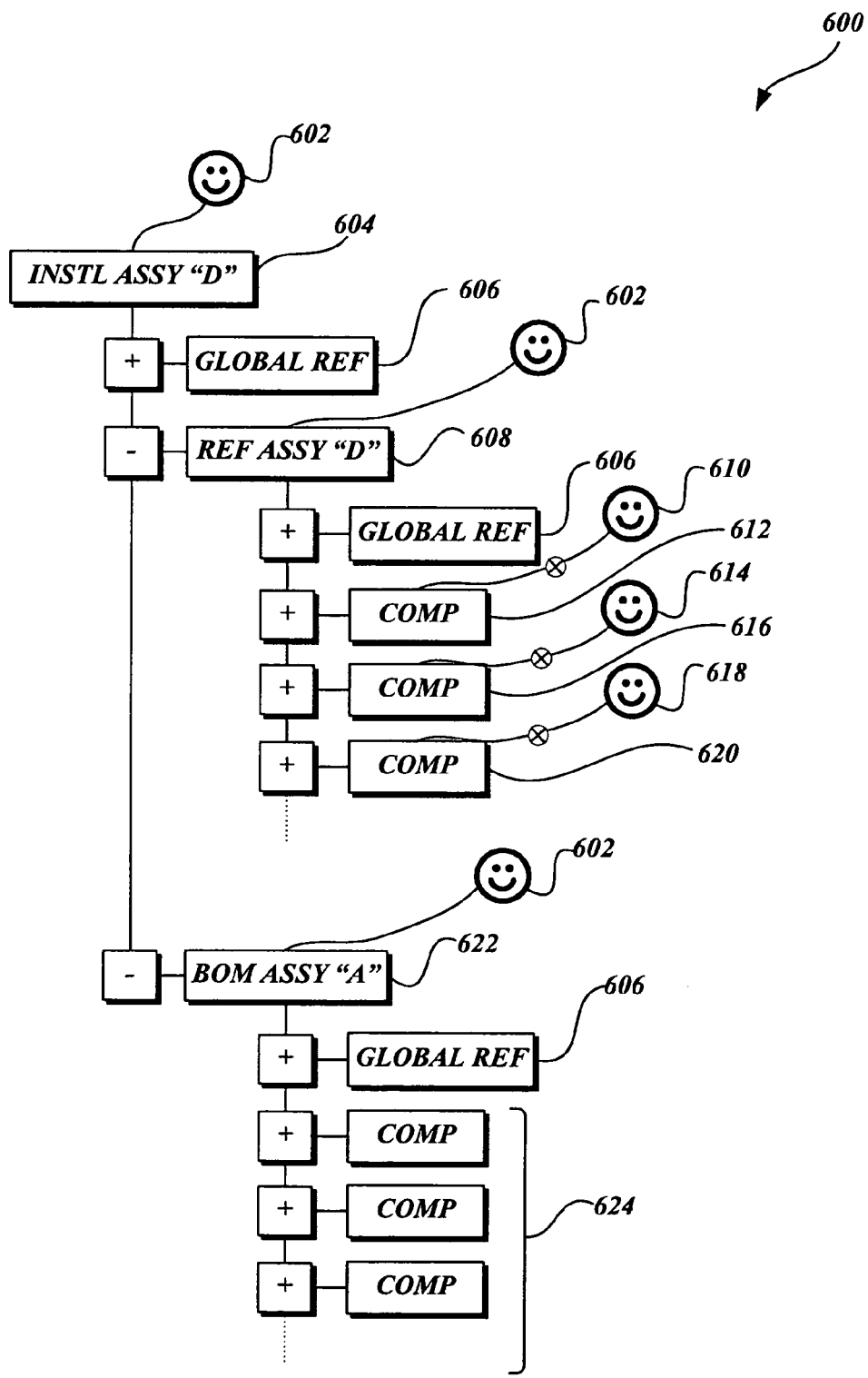
FIG. 6 is a block diagram illustrating one embodiment of the present invention incorporating the Bottom-Up design.

FIG. 6 illustrates another embodiment of the present invention, where a portion of the product is modeled using the traditional Bottom-Up design (Variant II). In this embodiment, a person (602) is in charge of designing BOM assembly A (622) and therefore needs to create a reference assembly D (608) to define the design environment for the BOM assembly A (622). However, in some situations, suitable BOM assemblies to be reused (or referenced) in the reference assembly D (608) may not exist, and cannot or will not be created in a timely manner due to resource limitations or some other reason. In such a case, the person (602) responsible for designing the BOM assembly A (622) may add individual component models (612), (616), (620), etc. one by one to the reference assembly D (608). The individual component models (612), (616), (620), etc. are the responsibilities of different persons (610), (614), (618), etc., respectively. Using this approach illustrated in FIG. 6, the traditional Bottom-Up design method can be used within a modular element of the design. Specifically, in the example of FIG. 6, the person (602) can build the reference assembly D (608) by collecting the individual component models (612), (616), (620), etc. as in the Bottom-Up design method.

It should be appreciated, however, that this approach introduces risks and shortcomings inherent in the traditional Bottom-Up design method. Specifically, there is an increased risk of specifying incorrect component models and/or component model locations and also reduced support for concurrent design. This is because the persons (610), (614), (618), etc. with the true design responsibility for specifying and locating (or positioning) the component models (612), (616), (620), etc. are not performing that task. Instead, the person (602) in charge of creating the installation assembly D (604) for designing the BOM assembly (622) assumes that responsibility, perhaps with limited knowledge of the correct component models and/or component model locations. Additionally, only those changes that occur within the original component models (612), (616), (620), etc. will be automatically reflected in the reference assembly D (608), and any other changes made outside of the original component models to affect the reference assembly D (608) (e.g., changes that add, replace, remove, or relocate the component models within respective BOM assemblies) must be incorporated manually in the reference assembly D (608). For these reasons, in one embodiment, a CAD program may be configured to conditionally prevent or restrict the use of the Variant II approach (using the Bottom-Up design within the modular design) in order to programmatically enforce consistent modeling standards. Specifically, in this embodiment, a user is not allowed to include component models (i.e., parts and/or component assemblies) themselves in a reference assembly, independently of the BOM assemblies of which they are a part.

Figure 1A:
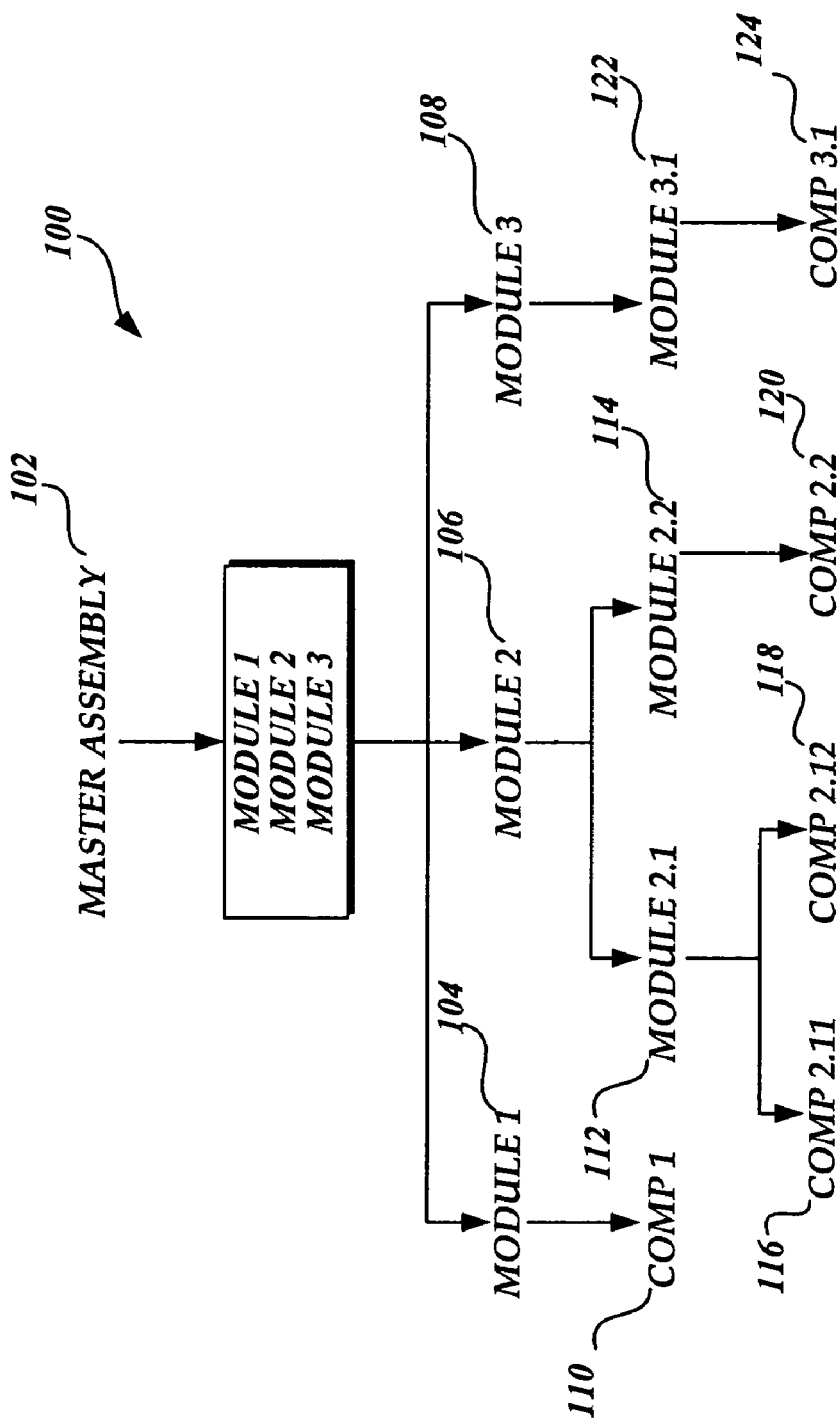
FIGS. 1A–1C are block diagrams illustrating prior art relevant to the present invention.
Figure 1B:
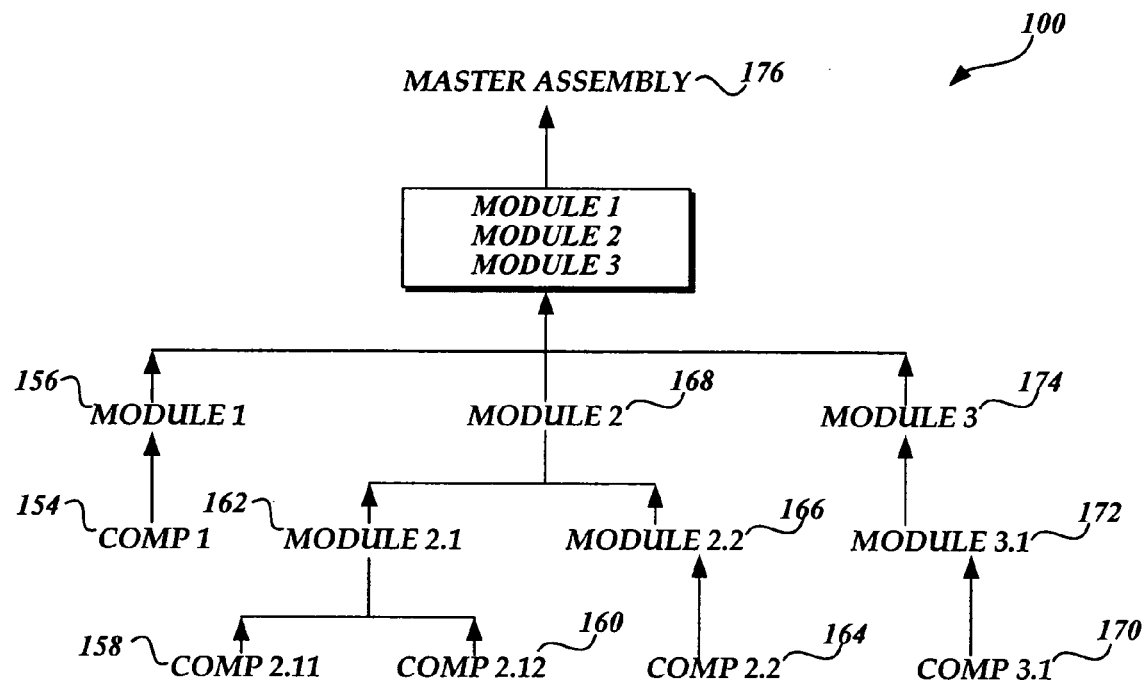
Figure 1C:
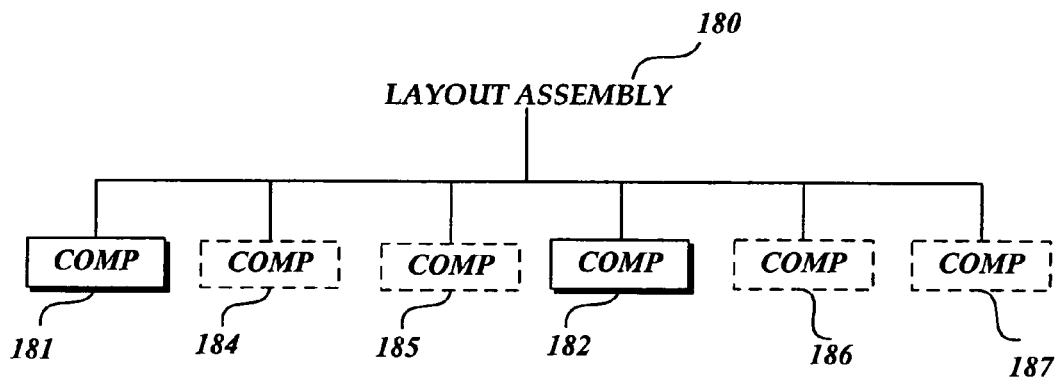

The reference assembly previously described is an "associated" reference assembly, i.e., a reference assembly that is created for the reference needs of a specific installation assembly to design a specific BOM assembly. In accordance with another embodiment of the present invention, one or more "master" reference assemblies may be used (Variant III). Master reference assemblies define standardized reference environments that could be used in multiple installation assemblies either in place of the "associated" reference assembly, or within the "associated" reference assembly, thus reducing duplication of effort amongst multiple designers who need to reference identical portions of the product, i.e., who need the common design environment(s) for their respective design responsibilities. A master reference assembly could be anything from a Master Assembly of an entire product (as in Top-Down design, see 102 in FIG. 1A) down to a single BOM Assembly or component (if the Bottom-Up approach of Variant II, described above, is allowed). In general, "master" reference assemblies will be larger than "associated" reference assemblies in order to meet the reference needs of multiple installation assemblies, but smaller than a Master Assembly of the entire product. Design responsibility for "master" reference assemblies are generally independent of the design responsibilities for the installation assemblies in which these "master" reference assemblies are used. This is in contrast to "associate" reference assemblies, each of which is the responsibility of the designer assigned to create the associated installation assembly.

It should be noted that various embodiments as described above (Variants I, II, and III) may be simultaneously used in various combinations and/or degrees. For example, in the case of designing a truck, it may be desirable to design a portion of the truck, such as the engine, using the Top-Down method. In this case, the master engine assembly would be the top-level BOM assembly (as in variant I) within the engine installation assembly. The design environment for the engine installation assembly may include several BOM assemblies for the portions of the truck to be referenced such as: the frame, front suspension, steering system, cooling system, cab firewall, etc. Each of these BOM assemblies could be included directly in the engine installation's reference assembly (as in the preferred embodiment), or it may be desirable to build a "master" reference assembly (as in variant III) that includes some, or all, of these BOM assemblies. The "master" reference assembly could then be re-used in multiple other installation assemblies, such as for the installation of different engines, either as the reference assembly for the installation, or within the installation's reference assembly.

At the same time, there may be additional components that would be desirable within the design environment, but that are not part of an existing BOM assembly or an existing "master" reference assembly. For example: components of a right hand steer system that the engine installation must be compatible with, but that will not be part of the initial product implementation, may not be part of any existing (and appropriate) BOM assembly, and no designer has any design responsibilities for that portion of the product. In such a case, the designer responsible for the engine installation assembly may assume limited responsibility by specifying and locating the right hand steer components in the engine installation's reference assembly (as in variant II). Alternatively, if such BOM and "master" reference assemblies are available, the engine installation's reference assembly could include: BOM Assemblies (as in the preferred embodiment) of the firewall and the left hand steering system, and a "master" reference assembly (as in variant III) that includes BOM assemblies of the frame, the front suspension, and the cooling system. Further alternatively, individual components of the right hand steer system that are not part of appropriate BOM assemblies may be individually added to the reference assembly (as in variant II), while the engine installation's BOM assembly is itself a Master Assembly (as in variant I) of the engine. This ability of the modular design method of the present invention to incorporate elements of both the Top-Down design (variants I & III) and the Bottom-Up design (variant II) to various degrees is advantageous since it allows the optimum balance to be struck between the Top Down and Bottom-Up design methods on a case by case basis.

Figure 7:
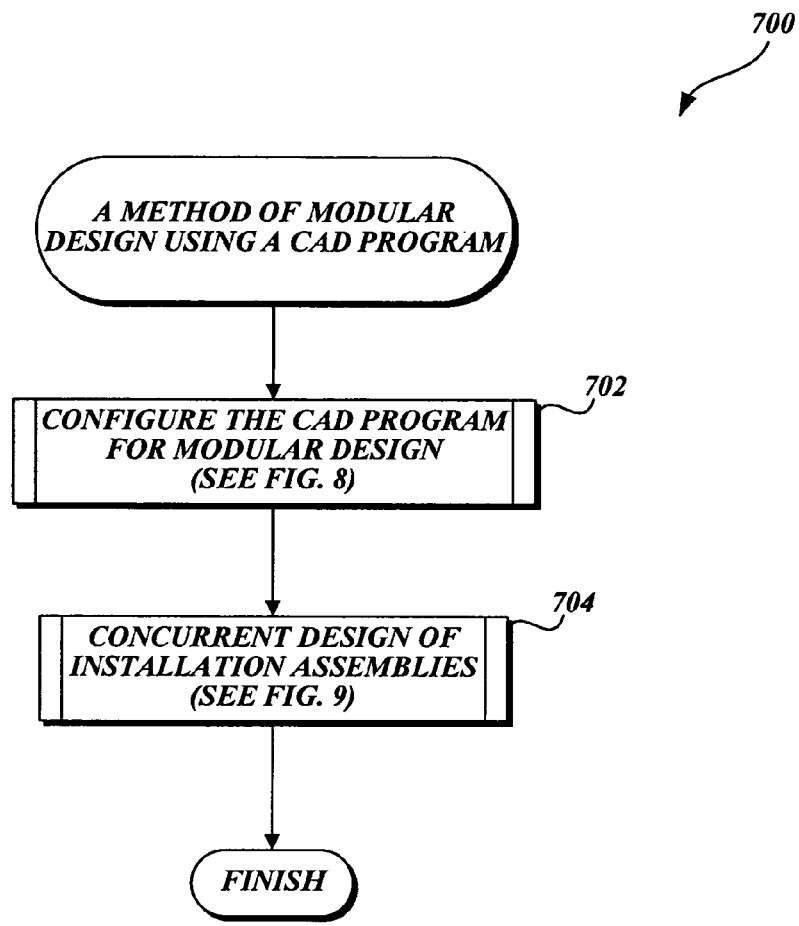
FIGS. 7–11 are process diagrams illustrating a method of modular design in accordance with the present invention.

FIGS. 7–11 illustrate a method (700) of modular design suitable for implementation, for example, in a computer-aided design (CAD) program. In FIG. 7, method (700) directed to the implementation of the modular design in a CAD program consists of two major steps. The first step is to configure the CAD program for modular design. See Block (702). The second step is to permit concurrent and consistent design of installation assemblies, perhaps by different designers, using the CAD program configured for modular design. See Block (704).

Figure 8:
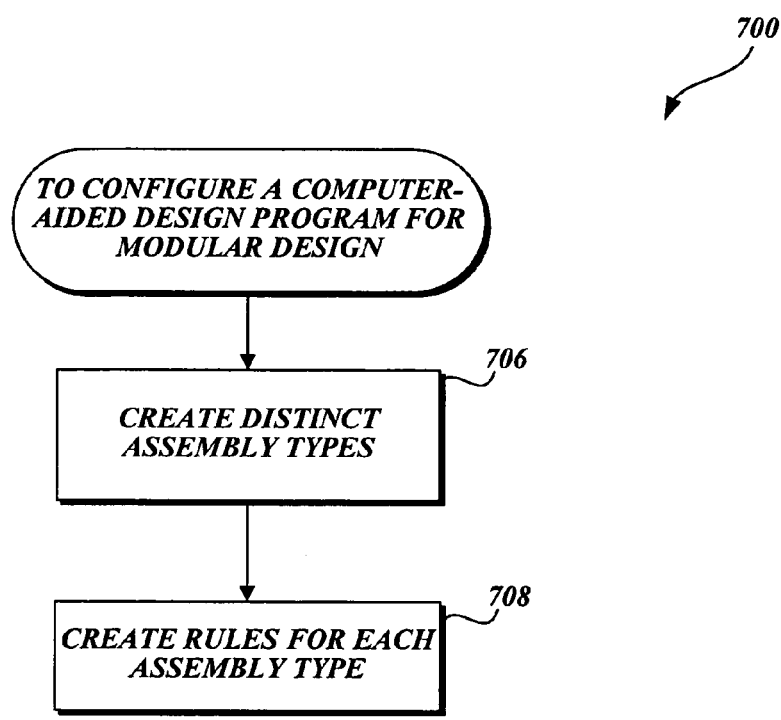

FIG. 8 illustrates the method of configuring a CAD program for modular design. First, distinct model types are created—for example, installation assembly, reference assembly, BOM assembly, and component model. See Block (706). Next, rules for each model type are established. See Block (702). For example, rules for a component model may specify that a component model may be a part (i.e. a component part) or an assembly (i.e. a component assembly), which may include only component parts and/or component assemblies, and that the component model may not include global references. Rules for a BOM assembly may specify that a BOM assembly may include only component models and/or sub-level associated BOM assemblies and require a minimum of one global reference. Rules for a reference assembly may specify that a reference assembly may include only component models and/or BOM assemblies and/or other "master" reference assemblies (but not other "associated" reference assemblies) and require a minimum of one global reference.

In one preferred embodiment, as described above, rules for a reference assembly may specify that a reference assembly may not include component models, in order to prohibit the use of the Variant II approach, i.e., in order to enforce consistent modeling standards. In addition, the rules may also specify that all included BOM and/or reference assemblies are to be constrained by one or more common global references between the parent reference assembly and the lower-level BOM or reference assembly. If multiple common global references are used, it is further required that those multiple common global references be located at common relative positions with respect to one another (for common product configurations) in the parent reference assembly and in its associated lower-level BOM or reference assembly.

Lastly, rules for an installation assembly may specify that an installation assembly may include only the BOM assembly that is associated with the installation assembly (that is, the BOM Assembly containing the components that the installation assembly locates), a reference assembly (which may be either an "associated" reference assembly or a "master" reference assembly), and global reference(s). Additionally, the rules may specify that all included BOM and reference assemblies are to be constrained by common global reference(s) (located at common relative positions when multiple global references are common) between the installation assembly and the lower-level BOM or reference assembly.

As described above, any of the associated model types may be referenced with each other using a naming convention and/or global reference(s). Therefore, the method of configuring a CAD program for modular design may include creating rules for enforcing a naming convention and the designation of common global reference(s) among the associated set of an installation assembly, a reference assembly, and a BOM assembly. For example, each of these distinct model types that jointly form one installation assembly may be automatically assigned a common global reference, or a common base number to which a unique suffix for each model type is attached (e.g., 555_INSTL, 555_REF, and 555_BOM.)

Preferably, the CAD program should be further configured to display the BOM assembly (including one or more component models) being designed in a state different from the rest of the assemblies so that a designer can easily distinguish what he is designing (i.e., the original BOM assembly) from its design environment (i.e., the reference assembly, perhaps consisting of one or more reused BOM assemblies). This can be achieved, for example, by displaying the reference assembly and all the referenced models contained therein in phantom line, while displaying the original BOM assembly that is being designed in solid line, in the installation drawing.

In accordance with one aspect of the present invention, the configuration of a CAD program, as described above, may be done centrally at the CAD server (252) (see FIG. 2). In accordance with another aspect of the present invention, a CAD program, which is specifically configured to support modular design of the present invention, may be provided as a computer-readable medium containing computer-readable instructions (i.e., software) for supporting the modular design. The software may be a complete CAD program including the modular design support, or an add-on program for supporting the modular design, which can be added to any existing CAD program. The actual programming of such software should be readily apparent to one of ordinary skill in the art, and therefore need not be disclosed in detail herein.

Figure 9:
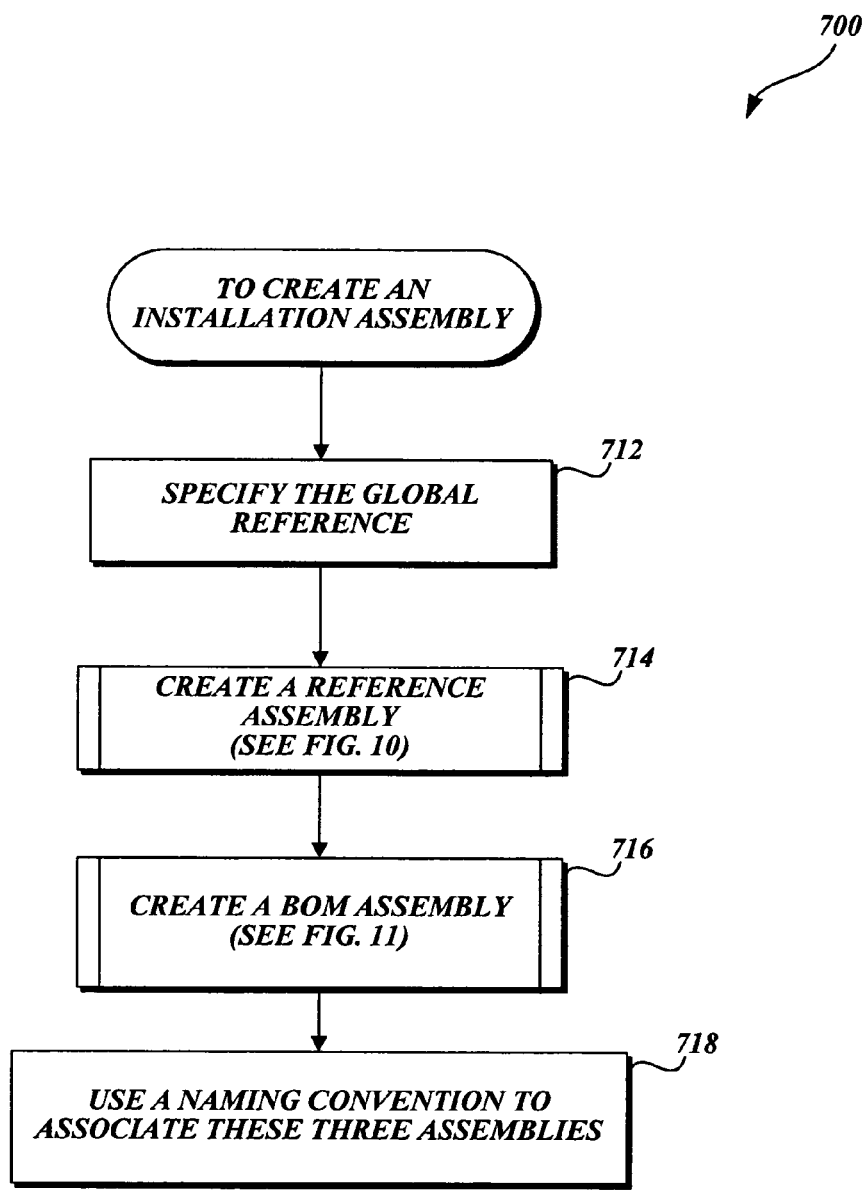

FIG. 9 illustrates the method of creating an installation assembly, to be performed by a designer using the CAD program configured to support modular design in accordance with the present invention. First, the designer specifies a global reference. See Block (712). Next, the designer creates a reference assembly (see FIG. 10 for further illustration). See Block (714). Then, the designer creates a BOM assembly (see FIG. 11 for further illustration). See Block (716). Further, a naming convention may be used to indicate the association between the installation assembly and its associated reference assembly and BOM assembly. See Block (718). As described above, the use of any naming convention may be imposed or forced on the designer by the CAD program configured to support modular design, if it includes rules concerning the naming convention.

Figure 10:
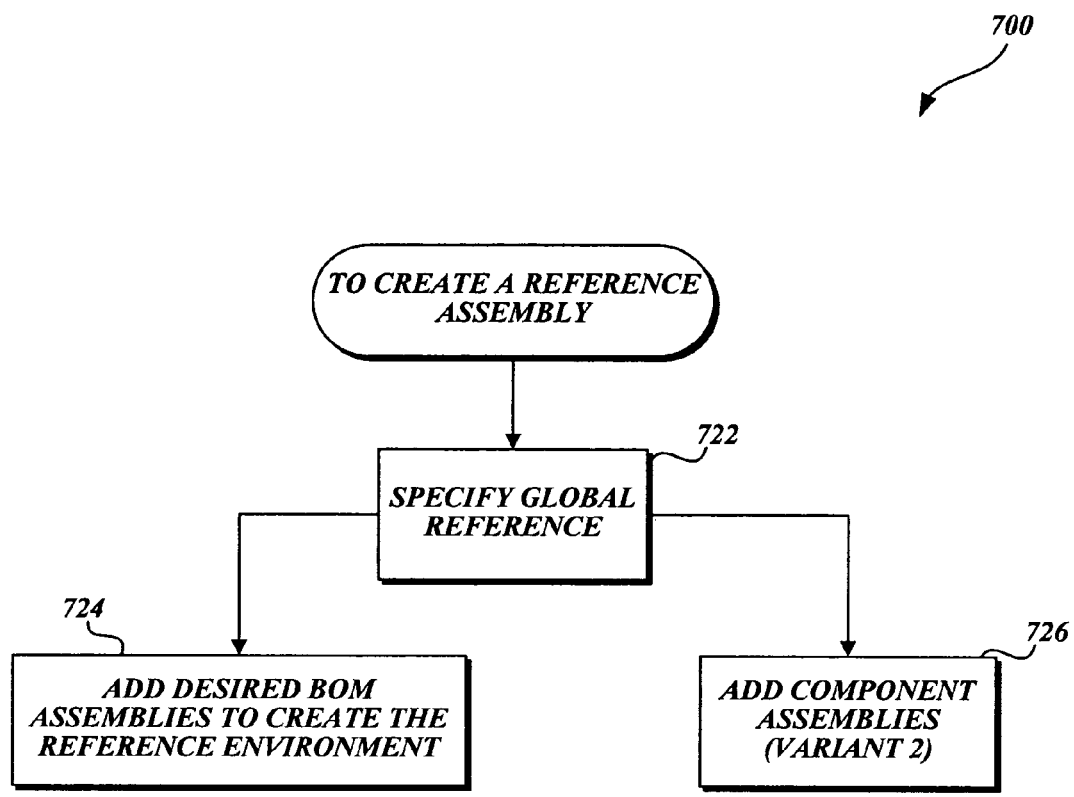

FIG. 10 illustrates the method of creating a reference assembly, to be performed by a designer. First, the designer specifies a global reference for the reference assembly. See Block (722). As described above, this global reference should be at least partially in common with the global reference of the associated installation assembly as defined in Block (712) in FIG. 9 above. As also described above, the global reference that is at least partially in common with the global reference of the corresponding installation assembly may be automatically assigned at this point, if the CAD program configured to support modular design includes rules for enforcing common global references amongst associated assemblies. Next, the designer adds any desired pre-configured BOM assemblies to the reference assembly to define a reference environment for designing the BOM assembly that the designer is responsible for. See Block (724). If the desired BOM assemblies are not readily available, individual component models can be added one by one to the reference assembly, in a typical Bottom-Up fashion. See Block (726). This is the Variant II approach illustrated in FIG. 6. As discussed above, however, the use of the Bottom-Up design has the risk of bringing about an inconsistent design environment, which invites design errors and duplication of effort. Therefore, in one preferred embodiment, a CAD program may be configured to conditionally prevent or restrict the use of the Variant II approach (using the Bottom-Up design within the modular design) in order to programmatically enforce consistent modeling standards.

Figure 11:
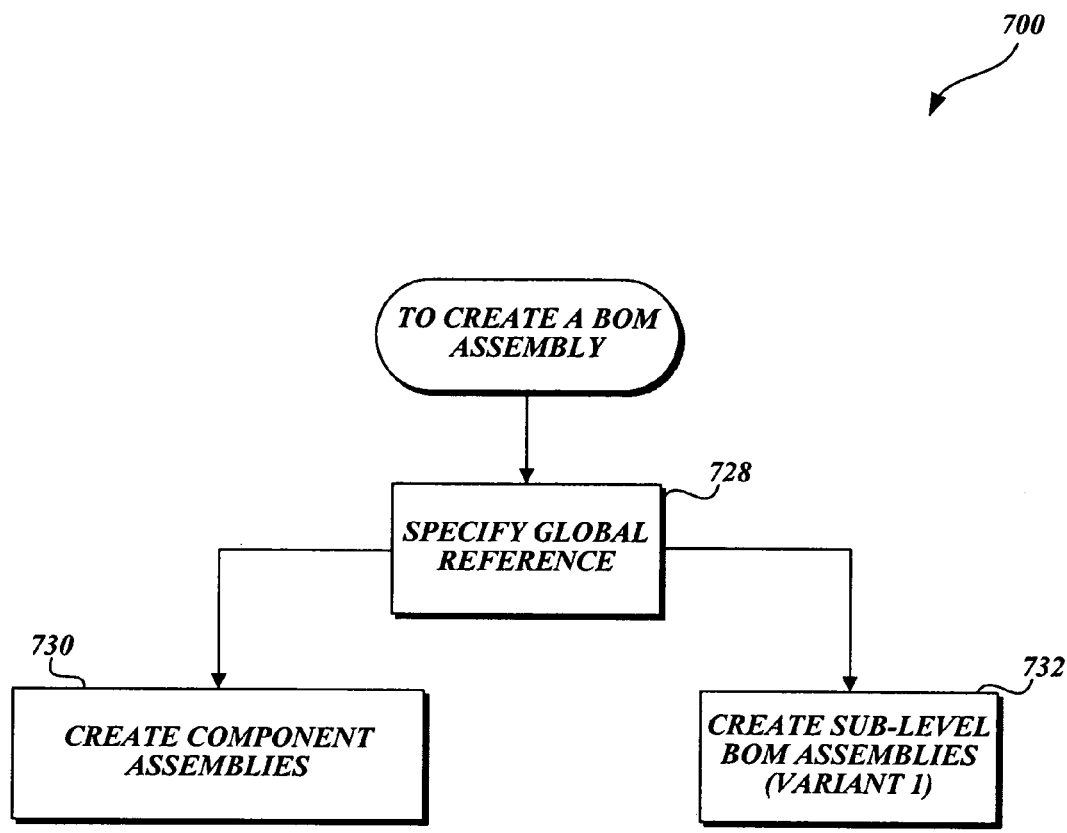

FIG. 11 illustrates the method of creating a BOM assembly, to be performed by a designer. First, the designer specifies a global reference for the BOM assembly. See Block (728). The global reference should be at least partially in common with the global reference of the associated installation assembly and reference assembly, as defined in Block (712) in FIG. 9 and Block (722) in FIG. 10, respectively. As described above, the global reference that is common with the global reference of the corresponding installation assembly and reference assembly may be automatically assigned at this point, if the CAD program configured to support modular design includes rules for enforcing common global references amongst associated assemblies. Next, the designer creates one or more component models and/or assembles one or more pre-existing component models to form the BOM assembly. See Block (730). In some situations, when the BOM assembly is to be created according to the Top-Down design method, then the designer creates sublevel BOM assemblies, and perhaps assigns the designing of these sublevel BOM assemblies to multiple designers. See Block (732). This is the Variant I approach illustrated in FIG. 5.

While the preferred embodiments of the invention have been illustrated and described, it will be appreciated that various changes can be made therein without departing from the spirit and scope of the invention.

The embodiments of the invention in which an exclusive property or privilege is claimed are defined as follows:

1. A computer-assisted method of modular design, comprising:
   (a) permitting users to apportion design responsibilities among themselves;
   (b) permitting each user to create an installation assembly for each design responsibility, comprising:
      (i) prompting a user to create a reference assembly, wherein the reference assembly contains one or more referenced assemblies; and
      (ii) prompting a user to create an original Bill-of-Material (BOM) assembly, wherein the original BOM assembly contains one or more component models and wherein the reference assembly defines a design environment for the user to create the original BOM assembly; and
   (c) automatically updating changes in any original BOM assembly, by reflecting the changes in the original BOM assembly in a reference assembly that contains the original BOM assembly as a referenced assembly.

2. The method of claim 1, which is incorporated in a computer-readable medium comprising computer-executable instructions for performing the method.

3. The method of claim 1, further comprising:
   enforcing a rule that a component model may be either a part, or a component assembly, that a component assembly may include only parts and/or other component assemblies, and that the component model may not include global references;
   enforcing a rule that a BOM assembly may include only component models or other associated sub-level BOM assemblies, and must include at least one global reference;

enforcing a rule that a reference assembly may include only BOM assemblies and/or other master reference assemblies, and may not include other associated reference assemblies, and must include at least one global reference; and enforcing a rule that an installation assembly may include only a BOM assembly that is associated with the installation assembly, and a reference assembly that is associated with the installation assembly or a master reference assembly, and may not include reference assemblies associated with other installation assemblies, and must include at least one global reference.

4. The method of claim 3, further comprising:

enforcing a rule that a reference assembly and its included BOM and/or reference assemblies are constrained together by being associated with one or more common global references; and enforcing a rule that an installation assembly and its included reference assembly and BOM assembly are constrained together by being associated with one or more common global references.

5. The method of claim 4, wherein when multiple common global references are used, these common global references have common relative positions with respect to one another for common product configurations.

6. The method of claim 1, further comprising the step of displaying the original BOM assembly in a different state from its associated reference assembly, to aid each user in visually recognizing the user's original BOM assembly in each installation assembly.

7. A method of modular design using a Computer Aided Design (CAD) program, comprising:
(a) configuring the CAD program for modular design, which comprises:
 (i) creating a distinct model types; and
 (ii) creating rules for each model type, and
(b) permitting concurrent design of installation assemblies of a product by one or more user wherein the distinct model types comprise:
 an installation assembly;
 a reference assembly;
 a Bill-of-Material (BOM) assembly; and
 a component model, wherein the reference assembly defines a design environment for a user to create the BOM assembly, wherein the rules for each model type comprise that:
a component model may be either a part, or a component assembly, that a component assembly may include only parts and/or other component assemblies, and that the component model may not include global references;

a BOM assembly may include only component models or other sub-level associated BOM assemblies, and must include at least one global reference;

a reference assembly may include only BOM assemblies and/or other master reference assemblies, and may not include other associated reference assemblies, and must include at least one global reference; and an installation assembly may include only a BOM assembly that is associated with the installation assembly, and a reference assembly that is associated with the installation assembly or a master reference assembly, and may not include reference assemblies associated with other installation assemblies, and must include at least one global reference.

8. The method of claim 7, wherein the rules further comprise that:
a reference assembly and its included BOM and/or reference assemblies are constrained together by being associated with one or more common global references; and an installation assembly and its included reference assembly and BOM assembly are constrained together by being associated with one or more common global references.

9. The method of claim 8, wherein when multiple common global references are used, these common global references have common relative positions with respect to one another for common product configurations.

10. A method of modular design using a Computer Aided Design (CAD) program, comprising:
(a) configuring the CAD program for modular design, which comprises:
 (i) creating a distinct model types; and
 (ii) creating rules for each model type, and
(b) permitting concurrent design of installation assemblies of a product by one or more users;

wherein the distinct model types comprise:
 an installation assembly;
 a reference assembly;
 a Bill-of-Material (BOM) assembly; and
 a component model, wherein the reference assembly defines a design environment for a user to create the BOM assembly, wherein the step (b) of permitting concurrent design of installation assemblies comprises:
(A) permitting the users to apportion design responsibilities among themselves;
(B) permitting each user to create an installation assembly for each design responsibility, wherein the creation of an installation assembly comprises the steps of:
 (i) creating a reference assembly, wherein the reference assembly contains one or more referenced assemblies; and
 (ii) creating an original BOM assembly; and
(C) automatically updating changes in any original BOM assembly, by reflecting the changes in the original BOM assembly in a reference assembly that contains the original BOM assembly as a referenced assembly.

11. The method of claim 10, wherein the step of configuring the CAD program further comprises causing the CAD program to display the original BOM assembly in a different state from its associated reference assembly, in each installation assembly.

12. A computer-readable medium containing computer-executable instructions to support modular design of plural installation assemblies of a product using a Computer Aided Design (CAD) program, the instructions when loaded onto a computer cause the computer to perform the steps comprising:
(a) prompting a user to define an installation assembly, comprising:
 (i) prompting a user to create a reference assembly, wherein the reference assembly contains one or more referenced assemblies; and
 (ii) prompting a user to create an original Bill-of-Material (BOM) assembly, wherein the reference assembly defines a design environment for the user to create the original BOM assembly; and
(b) automatically updating changes in any original BOM assembly, by reflecting the changes in the original BOM assembly in a reference assembly that contains the original BOM assembly as a referenced assembly.

13. The medium of claim 12, wherein the installation assembly, reference assembly, and BOM assembly are defined as distinct model types, and each model type is associated with a set of rules.

14. The medium of claim 13, wherein the rules for each model type comprise that:
   a BOM assembly may include only parts and/or component assemblies and/or other sub-level associated BOM assemblies, and must include at least one global reference;
   a reference assembly may include only BOM assemblies and/or other master reference assemblies, and may not include other associated reference assemblies, and must include at least one global reference; and
   an installation assembly may include only a BOM assembly that is associated with the installation assembly, and a reference assembly that is associated with the installation assembly or a master reference assembly, and may not include reference assemblies associated with other installation assemblies, and must include at least one global reference.

15. The medium of claim 14, wherein the rules further comprise that:
   a reference assembly and its included BOM and/or reference assemblies are constrained together by being associated with one or more common global references; and
   an installation assembly and its included reference assembly and BOM assembly are constrained together by being associated with one or more common global references.

16. The medium of claim 15, wherein when multiple common global references are used, these common global references have common relative positions with respect to one another for common product configurations.

17. The medium of claim 12, wherein the instructions when loaded onto a computer cause the computer to perform the further step of:
   causing the original BOM assembly to be displayed in a different state from its associated reference assembly, in each installation assembly.

18. The medium of claim 12, wherein a naming convention is enforced to associate an installation assembly with its corresponding reference assembly and its corresponding original BOM assembly.

19. The medium of claim 12, wherein the substep (a) of prompting a user to define an installation assembly further comprises:
   prompting a user to specify a global reference for the installation assembly.

20. The medium of claim 19, wherein the substep (a)(i) of prompting a user to create a reference assembly further comprises:
   prompting a user to specify a global reference for the reference assembly that is at least partially in common with the global reference of the associated installation assembly.

21. The medium of claim 20, wherein the substep (a)(ii) of prompting a user to create an original BOM assembly further comprises:
   prompting a user to specify a global reference for the original BOM assembly that is at least partially in common with the global reference of the associated installation assembly and/or reference assembly.

22. The medium of claim 12, wherein the substep (a)(i) of prompting a user to create a reference assembly comprises:
   prompting a user to add predefined BOM assemblies into the reference assembly.

23. The medium of claim 12, wherein the substep (a)(i) of prompting a user to create a reference assembly comprises:
   prompting a user to add one or more preconfigured master reference assemblies to the reference assembly.

24. The medium of claim 12, wherein the substep (a)(ii) of prompting a user to create an original BOM assembly comprises:
   prompting a user to configure one or more component models, or add one or more predefined component models, to form the BOM assembly.

25. The medium of claim 12, wherein the substep (a)(ii) of prompting a user to create an original BOM assembly comprises:
   prompting a user to create sublevel BOM assemblies under the BOM assembly.

* * * * *

UNITED STATES PATENT AND TRADEMARK OFFICE
CERTIFICATE OF CORRECTION

PATENT NO. : 7,110,842 B2 Page 1 of 1
APPLICATION NO. : 10/848729
DATED : September 19, 2006
INVENTOR(S) : J.J. Angelo It is certified that error appears in the above-identified patent and that said Letters Patent is hereby corrected as shown below:

| COLUMN | LINE | |
|---|---|---|
| Title Page item (73) Pg. 1, col. 1 | Assignee | "PACCAR Inc.," should read --PACCAR Inc,-- |
| 15 (Claim 7, | 36 line 5) | "a distinct" should read --distinct-- |
| 15 (Claim 7, | 40 line 8) | "more user" should read --more users;-- |
| 16 (Claim 10, | 19 line 5) | "a distinct" should read --distinct-- |

Signed and Sealed this

Fifteenth Day of May, 2007

JON W. DUDAS
*Director of the United States Patent and Trademark Office*